US012635459B2

(12) United States Patent (10) Patent No.: US 12,635,459 B2

Seddon (45) Date of Patent: May 19, 2026

(54) TEMPORARY SUBSTRATE CARRIERS

(71) Applicant: SEMICONDUCTOR COMPONENTS INDUSTRIES, LLC, Scottsdale, AZ (US)

(72) Inventor: Michael J. Seddon, Gilbert, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 377 days.

(21) Appl. No.: 18/355,048

(22) Filed: Jul. 19, 2023

(65) Prior Publication Data

US 2025/0029855 A1 Jan. 23, 2025

(51) Int. Cl.
B65D 61/00 (2006.01)
H10P 72/10 (2026.01)

(52) U.S. Cl.
CPC .............. H10P 72/17 (2026.01); B65D 61/00 (2013.01)

(58) Field of Classification Search
CPC ................................................... H01L 21/6734
See application file for complete search history.

(56) References Cited

FOREIGN PATENT DOCUMENTS

WO WO-2016083508 A1 * 6/2016 ....... H01L 21/68721

OTHER PUBLICATIONS

English translation WO2016083508 (Year: 2016).*

* cited by examiner

*Primary Examiner* — Jason L Vaughan
*Assistant Examiner* — Amanda Kreiling
(74) *Attorney, Agent, or Firm* — IPTechLaw

(57) ABSTRACT

Implementations of a substrate carrier may include a frame including an inner perimeter, the inner perimeter configured to be smaller than a perimeter of an organic substrate panel including multiple semiconductor die coupled thereto; and an outer perimeter configured to be larger than the perimeter of the organic substrate panel; wherein an edge of the frame between the inner perimeter and outer perimeter may be configured to rest against the organic substrate panel to prevent warpage during a heating operation.

19 Claims, 3 Drawing Sheets

TEMPORARY SUBSTRATE CARRIERS

BACKGROUND

1. Technical Field

Aspects of this document relate generally to carriers, such as devices for supporting objects like substrates for semiconductor devices.

2. Background

Substrates are used to mechanically support semiconductor die. The various semiconductor die are included in semiconductor packages that are designed to protect the semiconductor die from humidity or electrostatic discharge and assist with routing electrical signals from the semiconductor die to a circuit board or motherboard to which the semiconductor packages are attached.

SUMMARY

Implementations of a substrate carrier may include a frame including an inner perimeter, the inner perimeter configured to be smaller than a perimeter of an organic substrate panel including multiple semiconductor die coupled thereto; and an outer perimeter configured to be larger than the perimeter of the organic substrate panel; wherein an edge of the frame between the inner perimeter and outer perimeter may be configured to rest against the organic substrate panel to prevent warpage during a heating operation.

Implementations of a substrate carrier may include one, all, or any of the following:

The edge of the frame may be configured to rest on a largest planar side of the organic substrate panel to which the semiconductor die may be coupled.

The substrate carrier may include rotatable projections extending from the frame that may be configured to contact the organic substrate panel.

The rotatable projections may be configured to contact a largest planar side of the organic substrate panel opposite a largest planar side to which the semiconductor die may be coupled.

The edge of the frame may be configured to contact a largest planar side of the organic substrate panel opposite a largest planar side to which the semiconductor die may be coupled.

The substrate carrier may include rotatable projections extending from the frame where the rotatable projections may be configured to contact the largest planar side to which the semiconductor die may be coupled.

The edge of the frame may include a shoulder configured to rest against a largest planar side of the organic substrate panel.

Implementations of a substrate carrier may include a frame including an inner surface and an outer surface and a shoulder included in the inner surface where the shoulder of the frame may be configured to contact an organic substrate panel including multiple semiconductor die coupled thereto in order to prevent warpage during a heating operation.

Implementations of a substrate carrier may include one, all, or any of the following:

The shoulder of the frame may be configured to rest on a largest planar side of the organic substrate panel to which the semiconductor die may be coupled.

The substrate carrier may include rotatable projections extending from the frame that may be configured to contact the organic substrate panel.

The rotatable projections may be configured to contact a largest planar side of the organic substrate panel opposite a largest planar side to which the semiconductor die may be coupled.

The shoulder of the frame may be configured to contact a largest planar side of the organic substrate panel opposite a largest planar side to which the semiconductor die may be coupled.

The substrate carrier may include rotatable projections extending from the frame where the rotatable projections may be configured to contact the largest planar side to which the semiconductor die may be coupled.

Implementations of a substrate carrier may include a first frame including an inner surface and an outer surface and a first shoulder included in the inner surface; a second frame including an inner surface and an outer surface and a second shoulder included in the inner surface; and two or more couplers holding the first frame to the second frame. When the two or more couplers hold the first frame to the second frame, the first shoulder of the first frame and the second shoulder of the second frame may be configured to contact an organic substrate panel including multiple semiconductor die coupled thereto in order to prevent warpage during a heating operation.

Implementations of a substrate carrier may include one, all, or any of the following:

The first shoulder of the first frame may be configured to rest on a largest planar side of the organic substrate panel to which the semiconductor die may be coupled.

The second shoulder of the second frame may be configured to contact a largest planar side of the organic substrate panel opposite a largest planar side to which the semiconductor die may be coupled.

The two or more couplers may be two or more pins.

The two or more couplers may be two or more clips.

The two or more couplers may be two or more clamps.

The two or more couplers may be included in the first frame, the second frame, or in both the first frame and the second frame.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended substrate carriers will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such substrate carriers, and implementing components and methods, consistent with the intended operation and methods.

Figures 1, 2, 3:
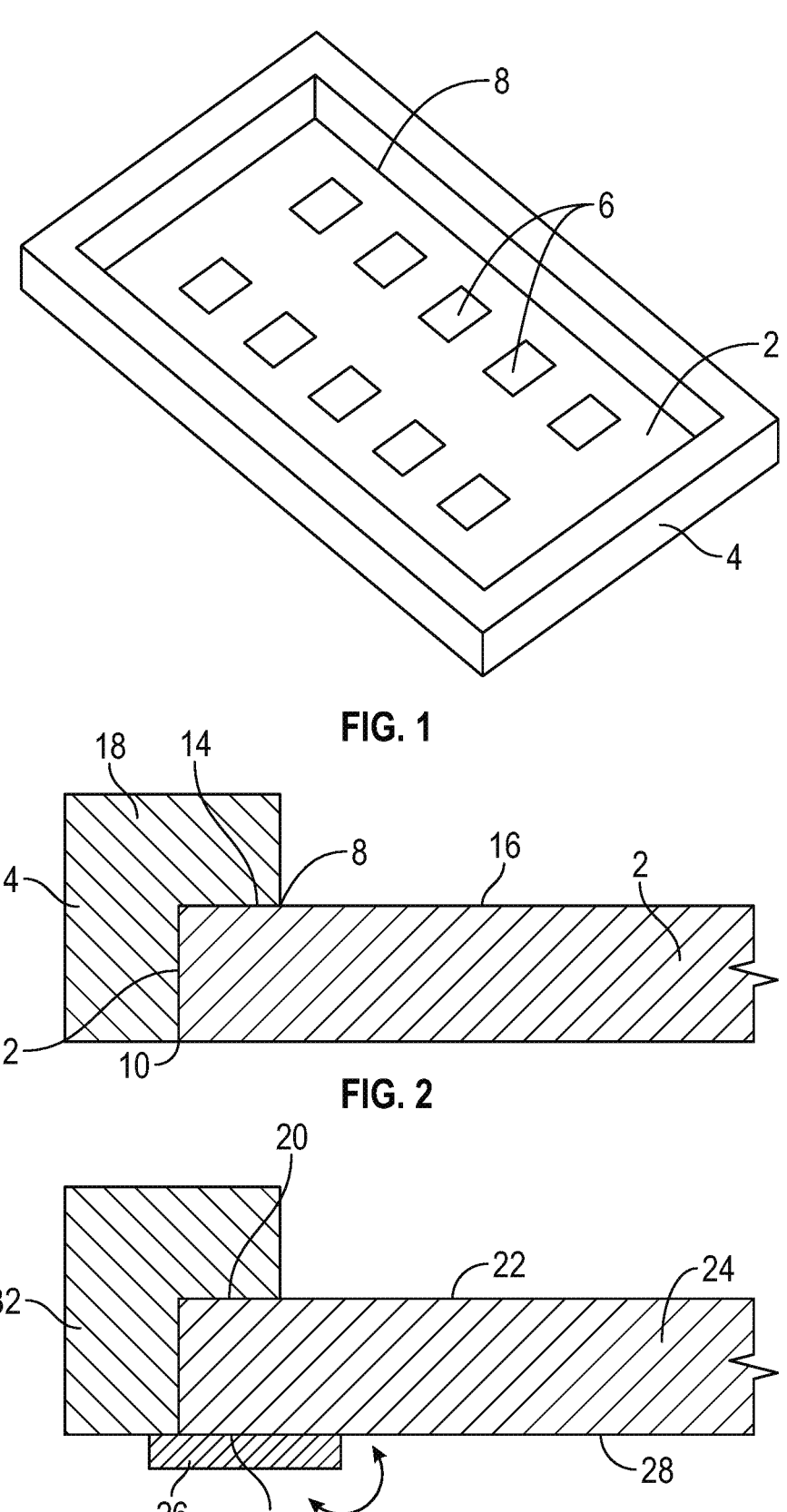
FIG. 1 is a perspective view of an implementation of a substrate carrier coupled to a substrate panel.
FIG. 2 is a cross sectional view of an implementation of a substrate carrier coupled to a substrate panel.
FIG. 3 is a cross sectional view of an implementation of a substrate carrier coupled to a substrate panel using a rotatable projection.

Referring to FIG. 1, an implementation of an organic substrate panel 2 is illustrated coupled to an implementation of a frame 4. As illustrated the organic substrate panel 2 includes a plurality of semiconductor die 6 coupled thereto using a die attach material that is cured using a heating process such as, by non-limiting example, a heated chuck, conduction heater blocks, an oven, or any other heating system. The curing behavior of the die attach material in various implementations is such that higher temperatures applied during the cure process result in increasing the adhesion force/strength between the semiconductor die 6 and the material of the organic substrate panel 2. Thus, increasing the adhesion force for a such a die attach material involves exposing the organic substrate panel 2 and the plurality of semiconductor die 6 to a higher temperature curing process.

Increasing the temperature to which the material of the organic substrate panel 2 is exposed, however, leads to increasing a warpage of the organic substrate panel for various types of organic substrate materials. If the warpage increases sufficiently during the cure process, the organic substrate panel 2 can lift away from the surface of conduction heater blocks (where such are used to heat the substrate) causing an uneven temperature profile to exist across the organic substrate panel. This uneven temperature profile can lead to variations in the ultimate adhesion force created by the cure process for each of the plurality of semiconductor die 6. This variation caused by the warpage of the organic substrate panel 2 can lead to seemingly random failures of the ultimately packaged semiconductor die when singulated from the organic substrate panel when tested using temperature cycle testing.

In the various substrate carrier implementations disclosed herein, the substrate carrier is configured to be used to work with panel-sized portions of substrate that include multiple die and, correspondingly, multiple semiconductor packages. This is in contrast with other carrier designs that are designed to hold only package-sized portions of substrate during assembly of the individual packages in various configurations. These panel-sized portions of substrate are designed to be processed as a panel and then singulated to form the various semiconductor packages. Because of the size of the panel-sized portions, they cannot be processed using carrier designs that hold only package-sized portions of substrate during the assembly operation.

The frame 4 of FIG. 1 is illustrated resting over the edge of the organic substrate panel 2 and is made of a material that has sufficient weight to hold the organic substrate panel 2 substantially flat during a die attach material curing operation or other heating/processing operation. The material of the frame may be, by non-limiting example, a metal, a plastic, a polymer, a metal alloy, aluminum, copper, steel, or any other material with sufficient density to hold the organic substrate panel flat when formed in a frame. As illustrated in FIG. 1 and with reference to FIG. 2, the frame 4 includes an inner perimeter 8 and an outer perimeter 10. As illustrated in FIG. 2, the inner perimeter 8 of the frame is smaller (shorter in length) than the outer perimeter 10 of the frame and the inner perimeter 8 is also smaller than the perimeter 12 of the organic substrate panel 2 while the outer perimeter 10 of the frame is larger than the perimeter 12 of the organic substrate panel 2. An edge 14 is present between the inner perimeter 8 and the outer perimeter 10 of the frame 4 which rests against the organic substrate panel 2. In the implementation illustrated in FIGS. 1 and 2, the edge 14 rests against the largest planar surface 16 of the organic substrate panel 2 to which the semiconductor die are attached (die side). In this way, the weight of the frame 4 is distributed around all four sides of the organic substrate panel 2 via the edge against the die side of the organic substrate panel 2, working to keep the panel flat as the temperature rises during the die attach material cure operation. In some implementations, the edge 14 and the portion 18 of the frame 4 that extend over the largest planar surface 16 of the die side of the organic substrate panel 2 can be referred to as a shoulder.

Referring to FIG. 3, the figure illustrates a cross section of a section of a frame similar in design to the implementation of FIG. 2 in that edge 20 rests against the largest planar surface 22 of organic substrate panel 24. However, in this implementation, rotatable projections 26 are present which rotate in and out of the plane of the paper (or in the plane of the paper, depending on the implementation) to contact the largest planar side 28 of the organic substrate panel 24 opposite the largest planar side 22 of the die side of the panel. These rotatable projections 26 may take a wide range of shapes, such as, by non-limiting example, rectangular cuboids, cylinders, triangular prisms, or any other closed three-dimensional shape with a flat edge 30 that can rest against the largest planar surface 28. The effect of the rotatable projections 26 is that organic substrate panel 24 is slightly lifted away from the surface on which the panel rests, but this effect may be negligible for heat transfer purposes where the thickness of the rotatable projections 26 is small compared to the thickness of the organic substrate panel 24 or the frame 32 itself. The rotatable projections 26 may be held against/rotatably coupled with the frame 32 through, by non-limiting example, pins, brads, rivets, screws, or any other rotatable mechanism. In some implementations, the pins may be integral with the material of the frame 32 or integral with the material of the rotatable projections 26. Depending on the tolerance defined between the edge 20 and the edge 30 of the rotatable projections, the organic substrate panel 24 can be held flat through the rigidity of the frame 32 without having to rely entirely on the weight of the frame to keep the organic substrate panel 24 flat to prevent warpage. In various implementations, the rotatable projections may be rotated manually into place as the frame is placed over the organic substrate panel; in other implementations, the rotatable projections may be rotated automatically by an external mechanism or by a mechanism that is attached to the frame itself. The material of the rotatable projections may be, by non-limiting example, a metal, metal alloy, plastic, polymer, rubber, resin, copper, aluminum, carbon, a carbon-containing material, steel, or any other metal or organic material.

Figure 4:
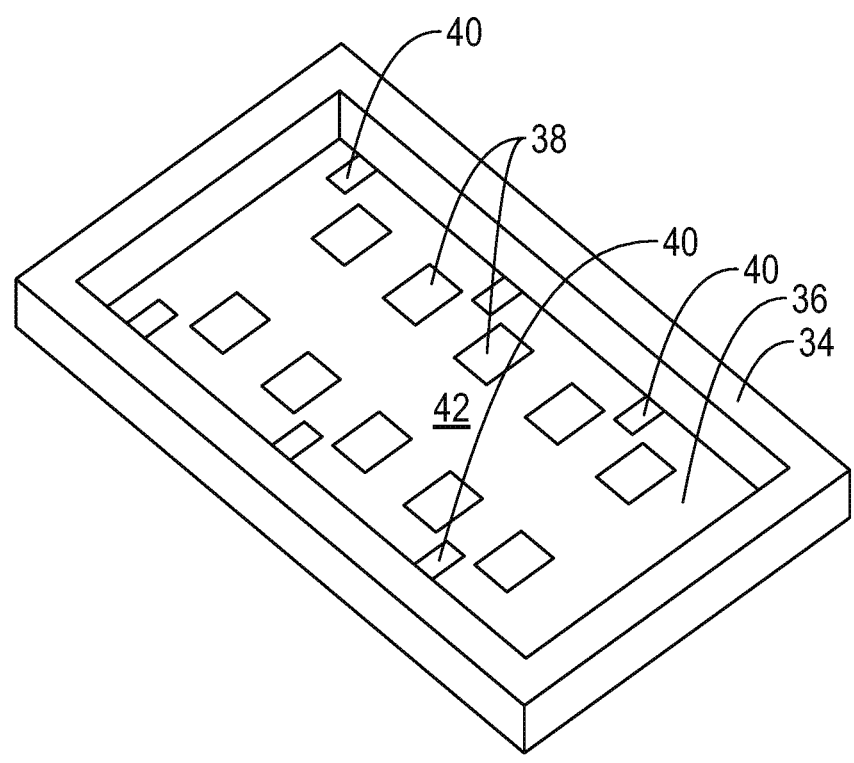
FIG. 4 is a perspective view of another implementation of a substrate carrier coupled to a substrate panel.
Figure 5:
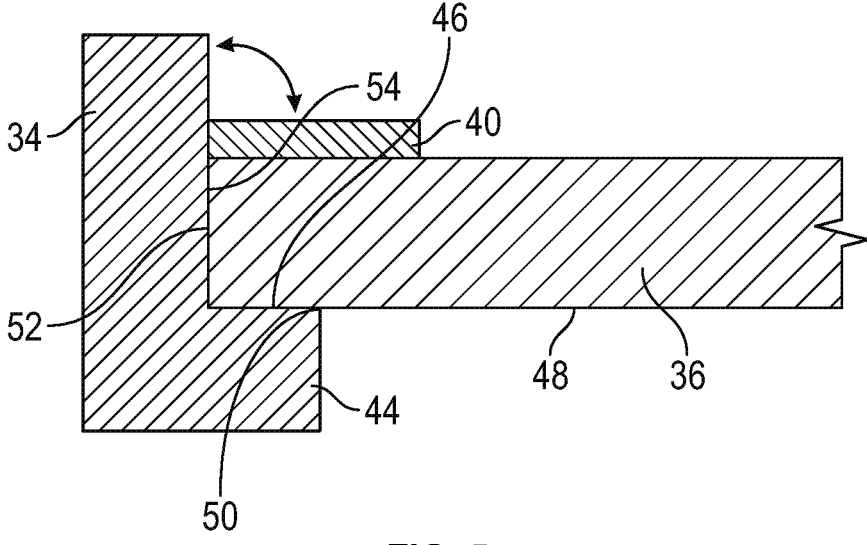
FIG. 5 is a cross sectional view of an implementation of a substrate carrier coupled to a substrate panel using a rotatable projection.

Referring to FIGS. 4 and 5, another implementation of a substrate carrier with frame 34 is illustrated coupled to organic substrate panel 36 to which a plurality of semiconductor die 38 have been attached using a die attach material. As illustrated, rotatable projections 40 are present which have been rotated out to contact the largest planar surface 42 of the die side of the organic substrate panel 36. Shoulder 44 extends from the frame 34 and includes edge/surface 46 that contacts the largest planar surface 48 of the organic substrate panel 36 opposite the die side. Similarly to the implementations illustrated in FIGS. 1-3, the inner perimeter 50 of the frame 34 is smaller than the outer perimeter 52 and also smaller than the perimeter 54 of the organic substrate panel 36. In this implementation, to hold the organic substrate panel 36 flat and prevent warpage, the use of the rotatable projections 40 is needed because the organic substrate panel is otherwise held against the frame 34 using gravity force only. Because the shoulder 44 of the frame 34 rests underneath the organic substrate panel 36, this frame implementation results in the organic substrate panel 36 being supported a distance equal to the thickness of the shoulder above the oven or other structure on which the frame 34 rests. This spacing may have some advantages in some implementations where airflow below the organic substrate panel 36 may be desired. The rotatable projections 40 may be any type and may be rotatably coupled using any type of coupling mechanism disclosed in this document in various implementations.

The material used for the frame 34 may be any disclosed in this document, including a carbon or carbon-containing material as further described herein. The material of the rotatable projections 40 may be any disclosed in this document.

Figure 6:
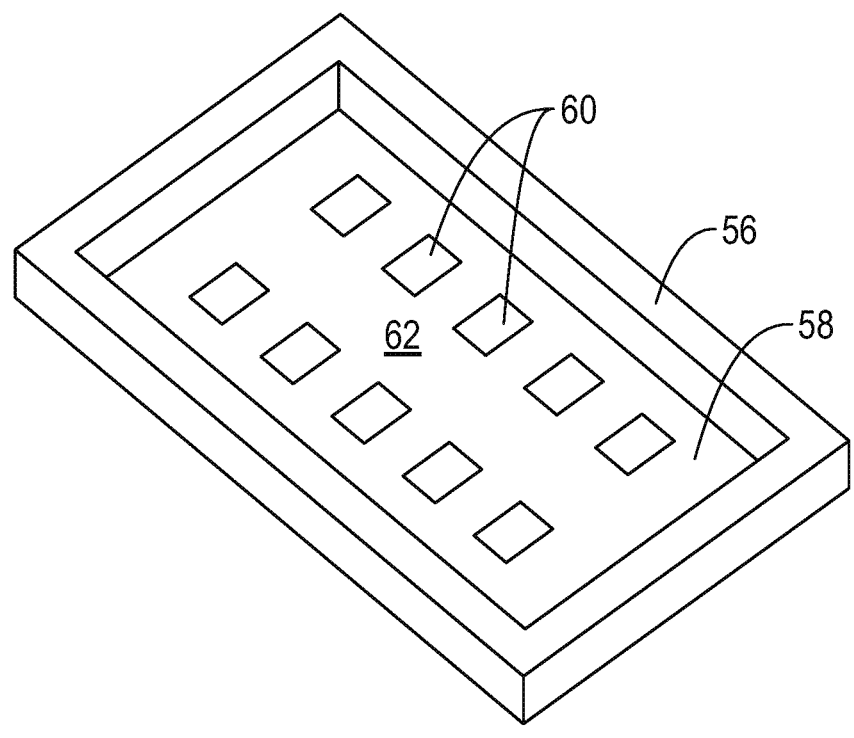
FIG. 6 is a perspective view of another implementation of a substrate carrier coupled to a substrate panel.
Figure 7:
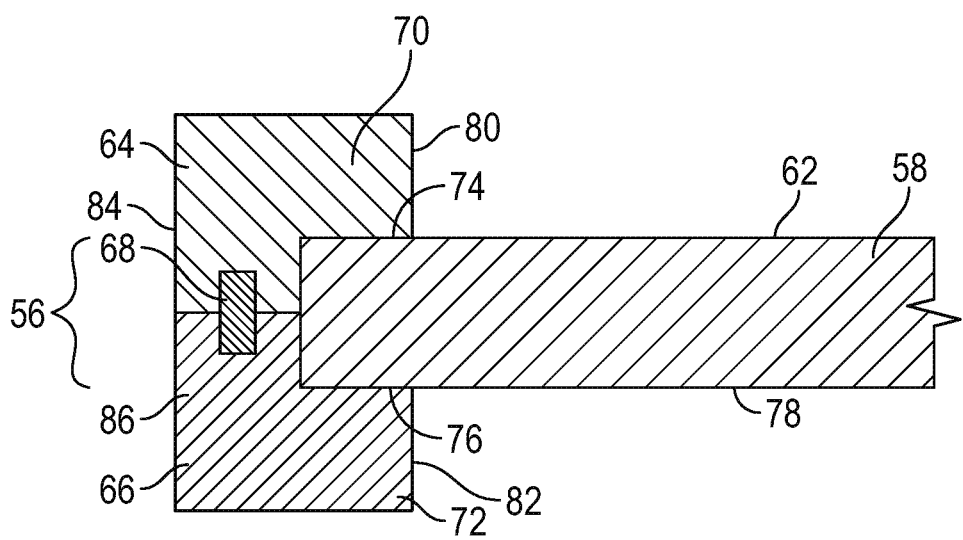
FIG. 7 is a cross sectional view of another implementation of a substrate carrier coupled to a substrate panel.

Referring to FIGS. 6 and 7, another implementation of a substrate carrier with frame 56 coupled to organic substrate panel 58 is illustrated. As with the other implementations, the organic substrate panel 58 includes various semiconductor die 60 coupled using die attach material to its largest planar side 62 (die side). As illustrated in the cross sectional view of FIG. 7, the frame 56 includes two portions, a first frame 64 and a second frame 66 which are coupled together using two or more couplers 68 (just one coupler is illustrated in FIG. 7). The first frame 64 includes first shoulder 70 and the second frame 66 includes second shoulder 72. The first shoulder 70 includes edge 74 that contacts the largest planar surface 62 of the die side of the organic substrate panel 58 and the second shoulder 66 includes edge 76 that contacts the largest planar surface 78 of the side of the organic substrate panel 58 opposite the die side. The first shoulder 70 and second shoulder 72 are part of the inner surfaces 80, 82 of the first frame 64 and second frame 66, respectively.

The first frame 64 and second frame 66 work together to hold the organic substrate panel 58 in a flat position defined by the respective first shoulder 70 and second shoulder 72. The two or more couplers 68 maintain the rigidly fixed relationship of the first frame 64 and second frame 66. The two more couplers 68 may be, by non-limiting example, pins, screws, clips, clamps, or other structures that are capable of fixedly coupling two rigid structures together. As illustrated in FIG. 7, the two or more couplers 68 may be included within the material of the first frame 64 and second frame 66 but be a separate structure/material. However, in other implementations, the two more couplers may be integrally formed of the material of the first frame, the material of the second frame, or from both the material of the first frame and the material of the second frame. In other implementations, the two or more couplers may be fixedly coupled to the first frame and removably couplable with the second frame or vice versa. In yet other implementations, some of the two or more couplers may be fixedly coupled to the first frame and to the second frame and removably couplable with the second frame and the first frame, respectively, in a corresponding relationship/pattern. Where the two or more couplers are clamps or clips, the two or more couplers may not couple to any of the portion of the first frame 64 and second frame 66 that face each other, but may couple to or across portions of the outer surfaces 84, 86 of the first frame 64 and second frame 66, respectively.

Because the organic substrate panel 58 is held between the first frame 64 and second frame 66, the organic substrate panel 58 may not touch the surface on which the second frame 66 rests, depending on the thickness of the second frame and/or the thickness of the second shoulder 72. This may be desirable to allow for airflow between the surface and the organic substrate panel 58. However, in various implementations, the spacing between the organic substrate panel 58 and the surface may be set by adjusting the thickness of the second frame and/or the thickness of the second shoulder 72. In various system and method implementations, the first frame 64, second frame 66, and the two or more couplers may be assembled with the organic substrate panel 58 manually or automatically using equipment that places the various components over/onto one another.

The material of the first frame 64 and second frame 66 may be the same in various implementations, or they may differ. The materials used for the first frame 64 and second frame 66 may be any disclosed in this document including carbon or carbon-containing materials.

The various implementations in FIGS. 5 and 7 illustrate the use of shoulders that separate the organic substrate panel from the surface upon which the frames rest. In other implementations, however, the frame or second frame may not include a shoulder, but may for a tray dimensioned to cover the entire largest planar surface of the organic substrate panel. In such implementations, conductive heat transfer from the surface may be directly conveyed to the organic substrate panel through the entire surface of the tray that contacts the surface on which the tray rests. In some implementations, part or all of the tray portion may be made of carbon or a carbon-containing material to aid in conduction of heat to the organic substrate panel.

The material of the organic substrate panel may be any of a wide variety of substrate types including, by non-limiting example, laminated substrates, FR4 substrates, FR-2 substrates, polyimide substrates, G-10 substrates, printed circuit boards, or any other substrate type that contains an organic component. The various semiconductor die that may be attached to the organic substrate panel may be, by non-limiting example, power semiconductor die, metal oxide field effect transistors (MOSFETs), bipolar junction transistors (BJTs), transistors, diodes, high-electron-mobility transistors (HEMTs), light emitting diodes (LEDs), or other semiconductor device types. Other passive components can also be included on the organic substrate panel, including, by non-limiting example, capacitors, resistors, inductors, switches, or any other passive electrical component type.

In places where the description above refers to particular implementations of substrate carriers and implementing components, sub-components, methods and sub-methods, it should be readily apparent that a number of modifications may be made without departing from the spirit thereof and that these implementations, implementing components, sub-components, methods and sub-methods may be applied to other substrate carriers.

What is claimed is:

1. A substrate carrier comprising:

a frame comprising an inner perimeter, the inner perimeter configured to be smaller than a perimeter of an organic substrate panel comprising multiple semiconductor die coupled thereto; and an outer perimeter configured to be larger than the perimeter of the organic substrate panel;

wherein an edge of the frame between the inner perimeter and outer perimeter is configured to rest over and against the organic substrate panel to prevent warpage during a heating operation; and wherein the organic substrate panel is configured to rest against a surface external to the frame when the organic substrate panel is coupled within the frame.

2. The substrate carrier of claim 1, wherein the edge of the frame is configured to rest on a largest planar side of the organic substrate panel to which the semiconductor die are coupled.

3. The substrate carrier of claim 2, further comprising rotatable projections extending from the frame that are configured to contact the organic substrate panel.

4. The substrate carrier of claim 3, wherein the rotatable projections are configured to contact a largest planar side of the organic substrate panel opposite a largest planar side to which the semiconductor die are coupled.

5. The substrate carrier of claim 1, wherein the edge of the frame is configured to contact a largest planar side of the organic substrate panel opposite a largest planar side to which the semiconductor die are coupled.

6. The substrate carrier of claim 5, further comprising rotatable projections extending from the frame wherein the rotatable projections are configured to contact the largest planar side to which the semiconductor die are coupled.

7. The substrate carrier of claim 1, wherein the edge of the frame comprises a shoulder configured to rest against a largest planar side of the organic substrate panel.

8. A substrate carrier comprising:

a frame comprising an inner surface and an outer surface and a shoulder comprised in the inner surface; and rotatable projections extending from the frame that are configured to contact the organic substrate panel;

wherein the shoulder of the frame is configured to contact an organic substrate panel comprising multiple semiconductor die coupled thereto in order to prevent warpage during a heating operation.

9. The substrate carrier of claim 8, wherein the shoulder of the frame is configured to rest on a largest planar side of the organic substrate panel to which the semiconductor die are coupled.

10. The substrate carrier of claim 8, wherein the rotatable projections are configured to contact a largest planar side of the organic substrate panel opposite a largest planar side to which the semiconductor die are coupled.

11. The substrate carrier of claim 8, wherein the shoulder of the frame is configured to contact a largest planar side of the organic substrate panel opposite a largest planar side to which the semiconductor die are coupled.

12. The substrate carrier of claim 11, further comprising rotatable projections extending from the frame wherein the rotatable projections are configured to contact the largest planar side to which the semiconductor die are coupled.

13. A substrate carrier comprising:

a first frame comprising an inner surface and an outer surface and a first shoulder comprised in the inner surface;

a second frame comprising an inner surface and an outer surface and a second shoulder comprised in the inner surface; and two or more couplers holding the first frame to the second frame;

wherein when the two or more couplers hold the first frame to the second frame, the first shoulder of the first frame and the second shoulder of the second frame are configured to contact an organic substrate panel comprising multiple semiconductor die coupled thereto in order to prevent warpage during a heating operation; and wherein a height of the organic substrate panel is configured to extend beyond an uppermost height of the first frame when the organic substrate panel is coupled between the first frame and the second frame.

14. The substrate carrier of claim 13, wherein the first shoulder of the first frame is configured to rest on a largest planar side of the organic substrate panel to which the semiconductor die are coupled.

15. The substrate carrier of claim 13, wherein the second shoulder of the second frame is configured to contact a largest planar side of the organic substrate panel opposite a largest planar side to which the semiconductor die are coupled.

16. The substrate carrier of claim 13, wherein the two or more couplers are two or more pins.

17. The substrate carrier of claim 13, wherein the two or more couplers are two or more clips.

18. The substrate carrier of claim 13, wherein the two or more couplers are two or more clamps.

19. The substrate carrier of claim 13, wherein the two or more couplers are comprised in the first frame, the second frame, or in both the first frame and the second frame.

* * * * *